United States Patent
Katayama

(10) Patent No.: US 10,671,429 B2
(45) Date of Patent: Jun. 2, 2020

(54) CIRCUIT ASSIGNMENT WITHIN RECONFIGURABLE DEVICE BASED ON PREDICTED SHORTEST PROCESSING COMPLETION TIME

(71) Applicant: FUJITSU LIMITED, Kawasaki-shi, Kanagawa (JP)

(72) Inventor: Kentaro Katayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 137 days.

(21) Appl. No.: 15/708,185

(22) Filed: Sep. 19, 2017

(65) Prior Publication Data

US 2018/0107511 A1    Apr. 19, 2018

(30) Foreign Application Priority Data

Oct. 13, 2016  (JP) ................. 2016-201519

(51) Int. Cl.
| | |
|---|---|
| *G06F 9/48* | (2006.01) |
| *G06F 9/52* | (2006.01) |
| *G06F 15/78* | (2006.01) |
| *G06F 30/34* | (2020.01) |
| *H03K 19/17756* | (2020.01) |
| *G06F 9/50* | (2006.01) |

(52) U.S. Cl.
CPC ............ *G06F 9/4881* (2013.01); *G06F 9/52* (2013.01); *G06F 15/7867* (2013.01); *G06F 30/34* (2020.01); *H03K 19/17756* (2013.01); *G06F 9/5005* (2013.01); *G06F 9/5066* (2013.01); *G06F 9/5083* (2013.01)

(58) Field of Classification Search
None
See application file for complete search history.

(56) References Cited

U.S. PATENT DOCUMENTS 6,462,579 B1 * 10/2002 Camilleri ......... H03K 19/17736
326/38
6,678,065 B1    1/2004 Hikawa
(Continued)

FOREIGN PATENT DOCUMENTS

| | | |
|---|---|---|
| JP | H11-205493 | 7/1999 |
| JP | 2006-024180 | 1/2006 |

(Continued)

*Primary Examiner* — Abu Zar Ghaffari
(74) *Attorney, Agent, or Firm* — Fujitsu Patent Center

(57) ABSTRACT

An information processing apparatus includes: a reconfiguration device which can change a circuit configuration through a dynamic partial reconfiguration; and a controller which controls a circuit arrangement in the reconfiguration device, in which when a processing circuit related to a new task is arranged in the reconfiguration device, the controller determines a circuit assignment of a processing circuit related to an existing task in execution and the processing circuit related to the new task with respect to an area as a result of combining an area used for the processing circuit related to the existing task in execution and a space area, based on a predicted end time of the processing of the respective tasks, and arranges the processing circuits related to the respective tasks in the reconfiguration device in accordance with the determined circuit assignment.

5 Claims, 9 Drawing Sheets

(56) References Cited

U.S. PATENT DOCUMENTS

| | | | | |
|---|---|---|---|---|
| 7,433,528 B2* | 10/2008 | Nishikawa | G06T 1/20 | 375/240 |
| 7,624,295 B2* | 11/2009 | Taketoshi | G06F 1/3203 | 713/500 |
| 8,214,618 B2* | 7/2012 | Jeong | G06F 12/10 | 711/154 |
| 8,482,571 B2* | 7/2013 | Shiraki | G06T 1/20 | 345/501 |
| 9,317,331 B1* | 4/2016 | Koh | G06F 9/5066 | |
| 2007/0150718 A1 | 6/2007 | Toi et al. | | |
| 2007/0198971 A1* | 8/2007 | Dasu | G06F 8/433 | 717/140 |
| 2007/0283358 A1* | 12/2007 | Kasahara | G06F 9/5044 | 718/104 |
| 2008/0229081 A1* | 9/2008 | Yamanaka | G06F 15/7867 | 712/221 |
| 2009/0219051 A1* | 9/2009 | Zhang | H03K 19/17752 | 326/38 |
| 2010/0228958 A1* | 9/2010 | Naito | G06F 15/7867 | 713/1 |
| 2011/0225415 A1* | 9/2011 | Yamada | H03K 19/17752 | 713/100 |
| 2012/0185864 A1* | 7/2012 | Toukmaji | G06F 9/4881 | 718/104 |
| 2014/0108828 A1* | 4/2014 | Breternitz | G06F 1/329 | 713/300 |
| 2014/0173614 A1* | 6/2014 | Konik | G06F 9/4881 | 718/104 |
| 2014/0310722 A1* | 10/2014 | McGaughy | G06F 9/5066 | 718/105 |
| 2016/0321115 A1* | 11/2016 | Thorpe | H04L 47/823 | |
| 2016/0335127 A1* | 11/2016 | Artmeier | G06F 9/5044 | |
| 2017/0017539 A1* | 1/2017 | Guccione | G06F 11/0769 | |
| 2017/0242672 A1* | 8/2017 | Bean | G06F 8/4441 | |
| 2017/0293994 A1* | 10/2017 | Li | G06T 1/20 | |
| 2017/0323045 A1* | 11/2017 | Huang | G06F 30/34 | |
| 2018/0129770 A1* | 5/2018 | Tamir | G06F 13/1673 | |
| 2018/0246770 A1* | 8/2018 | Yu | G06F 9/5011 | |

FOREIGN PATENT DOCUMENTS

| | | |
|---|---|---|
| JP | 2007-179358 | 7/2007 |
| JP | 2015-191335 | 11/2015 |

* cited by examiner

F I G. 1
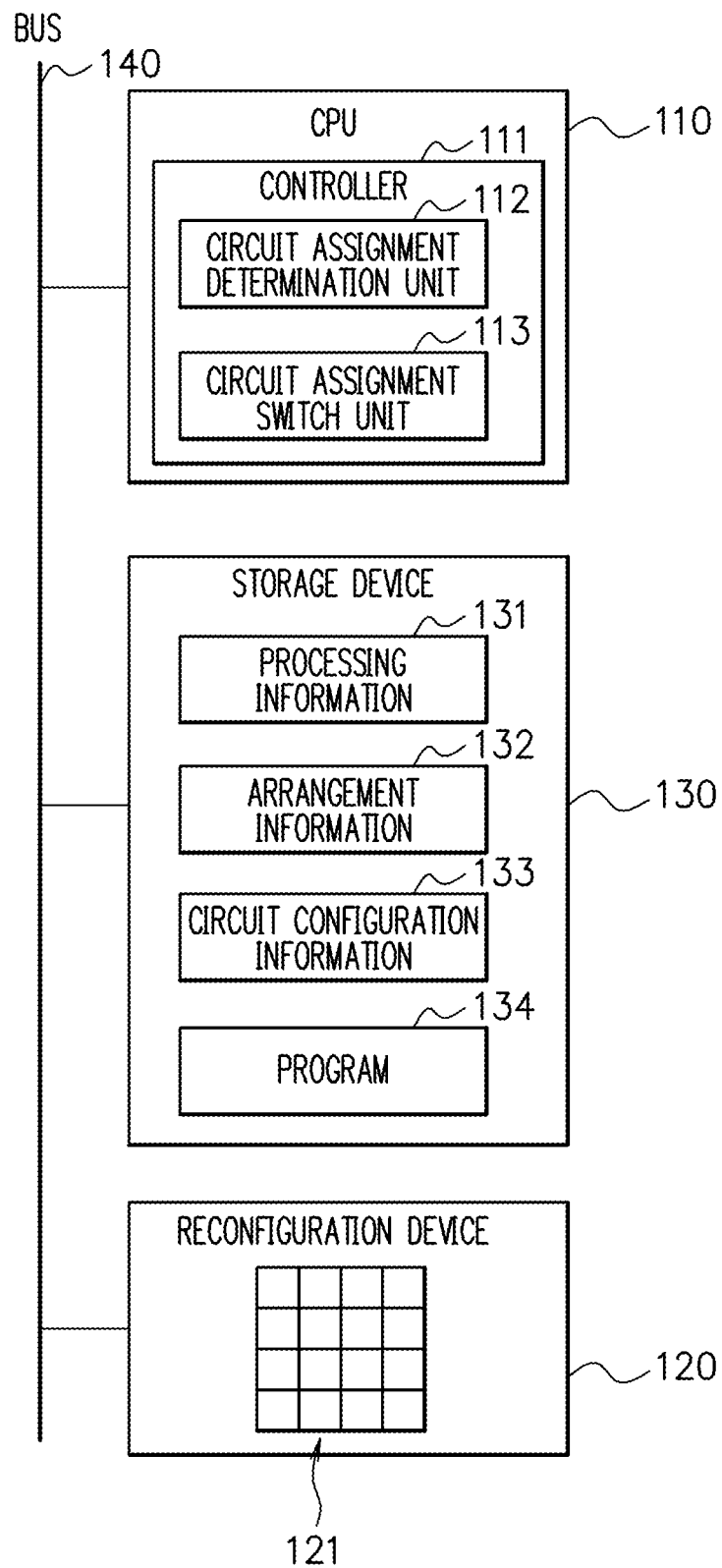

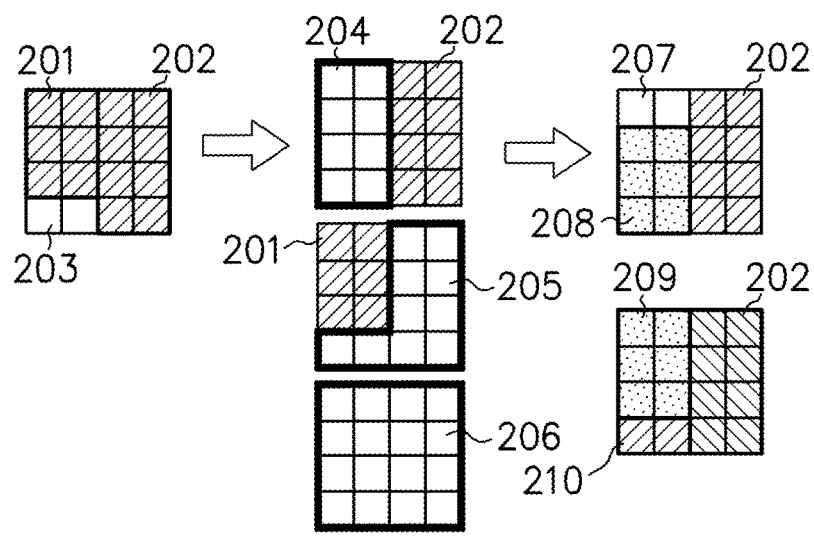
F I G. 2A
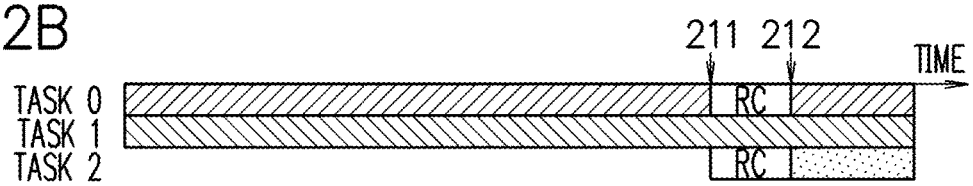
F I G. 2B
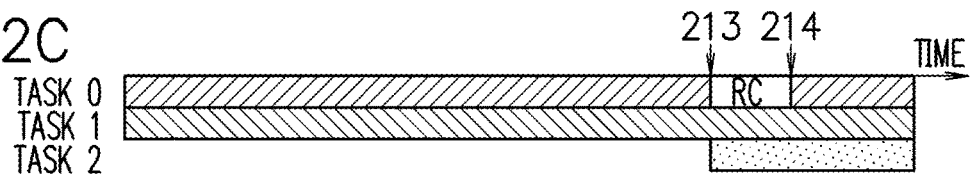
F I G. 2C
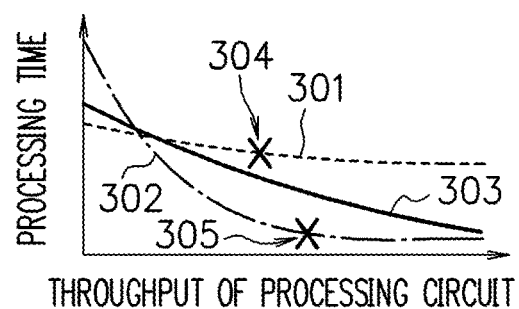
F I G. 3A
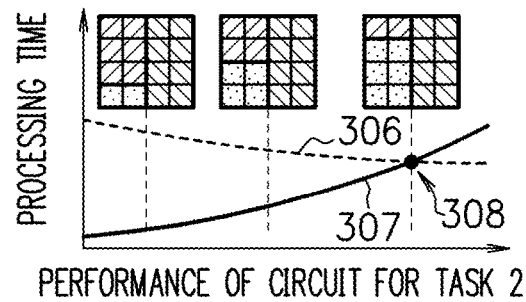
F I G. 3B

CIRCUIT ASSIGNMENT WITHIN RECONFIGURABLE DEVICE BASED ON PREDICTED SHORTEST PROCESSING COMPLETION TIME

CROSS-REFERENCE TO RELATED APPLICATION

This application is based upon and claims the benefit of priority of the prior Japanese Patent Application No. 2016-201519, filed on Oct. 13, 2016, the entire contents of which are incorporated herein by reference.

FIELD

The embodiments discussed herein are directed to an information processing apparatus, an information processing method, and a non-transitory computer-readable recording medium.

BACKGROUND

There is an information processing apparatus including a central processing unit (CPU) and a field programmable gate array (FPGA) capable of changing a configuration of a programmable logic circuit, and executing, with the use of the FPGA, processing suitable for processing by hardware. For example, an FPGA accelerator is used for realizing speed-up of data processing such as data search processing. Processing by the CPU is limited to parallel processing in accordance with the number of cores, but, processing by the FPGA enables speed-up of processing through pipelining or parallel processing so far as a circuit resource permits. However, as the FPGA becomes higher performance by increasing the number of stages of pipeline or increasing a degree of parallel processing, the number of arithmetic units or the number of flip-flops increases, resulting in that a circuit area increases.

There is an FPGA which enables a dynamic partial reconfiguration in which it is possible to partially change a configuration of a programmable logic circuit without stopping an operation of a logic circuit in operation (refer to Patent Document 1, for example). The FPGA enabling the dynamic partial reconfiguration can execute a plurality of tasks in an asynchronous manner with the use of one FPGA, by arranging a circuit related to a task to be newly executed in a space area, through the dynamic partial reconfiguration, without stopping another task in execution.

For example, when execution of a task A is requested in an initial state 1101 in which a circuit arrangement is not performed on any of a plurality of programmable areas as illustrated in FIG. 11A, a circuit 1102 related to the task A is arranged as exemplified in FIG. 11B, through a dynamic partial reconfiguration, to execute the task A. When, during the execution of the task A, execution of another task B is requested, a circuit 1103 related to the task B is arranged as exemplified in FIG. 11C, through a dynamic partial reconfiguration, to execute the task B. When execution of another task C is further requested, a circuit 1104 related to the task C is arranged as exemplified in FIG. 11D, through a dynamic partial reconfiguration, to execute the task C.

After that, when the task B is terminated, the area used for the task B is set to a space area, as illustrated in FIG. 11E. When, in the state illustrated in FIG. 11E, execution of another task D is requested during the execution of the task A and the task C, a circuit 1105 related to the task D is arranged as exemplified in FIG. 11F, through a dynamic partial reconfiguration, to execute the task D. In a manner as described above, the FPGA enabling the dynamic partial reconfiguration can execute a plurality of tasks in an asynchronous manner with the use of one FPGA.

There is proposed an image forming apparatus in which, when performing concurrent processing of processing a plurality of types of jobs in a concurrent manner, an assigned amount of a shared resource such as a memory or a disk for each job during execution of job, is dynamically changed to be allocated so as to correspond to a priority order of the job (refer to Patent Document 2, for example). There is proposed a computer system in which, when assigning a logical processor to a new process, the logical processor is assigned so as to bring out a performance of a physical processor in accordance with a dependency relation between the process and a process to which a logical processor is already assigned, to thereby perform resource assignment which is optimum for execution of a program (refer to Patent Document 3, for example).

Patent Document 1: Japanese Laid-open Patent Publication No. 2015-191335
Patent Document 2: Japanese Laid-open Patent Publication No. 11-205493
Patent Document 3: Japanese Laid-open Patent Publication No. 2006-24180

When an FPGA accelerator is used, even in a case of tasks using the same accelerator circuit, processing amounts in the accelerator with respect to a processing amount of all of the tasks are not always the same. For this reason, an influence exerted on a processing time of the task by a performance of the accelerator is different depending on the tasks. Therefore, in order to improve a processing performance in the entire information processing apparatus, there is a need to properly assign a circuit resource of the FPGA to a task to be executed.

However, when a programmable area has an extra area in an FPGA enabling a dynamic partial reconfiguration, a circuit with high performance and large area is arranged, among a plurality of circuit configurations with different processing performances, resulting in that a circuit resource of the FPGA may be unnecessarily consumed. As a result of this, a circuit resource of the FPGA capable of being used by a succeeding task is reduced, and a throughput of the entire information processing apparatus is sometimes deteriorated.

SUMMARY

One aspect of an information processing apparatus includes: a reconfiguration device which includes a plurality of areas in which a logic can be programmed, and which can change a circuit configuration by performing a dynamic partial reconfiguration on the areas; and a controller which controls a circuit arrangement in the reconfiguration device. When a processing circuit related to a second task is arranged in the reconfiguration device in which a processing circuit related to a first task in execution is arranged, the controller determines a circuit assignment of the processing circuit related to the first task and the processing circuit related to the second task with respect to an area as a result of combining an area used for the processing circuit related to the first task and a space area in the reconfiguration device, based on a predicted end time of the processing of the first task and the second task, and arranges the processing circuits related to the respective tasks in the reconfiguration device in accordance with the determined circuit assignment.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of an information processing apparatus in an embodiment;

FIG. 2A to FIG. 2C are diagrams explaining a circuit assignment in a reconfiguration device in the present embodiment;

FIG. 3A is a diagram illustrating a relation between a throughput of each of processing circuits and a processing time;

FIG. 3B is a diagram illustrating a processing time of two tasks when changing a performance of the processing circuit;

DESCRIPTION OF EMBODIMENTS

Figure 4:
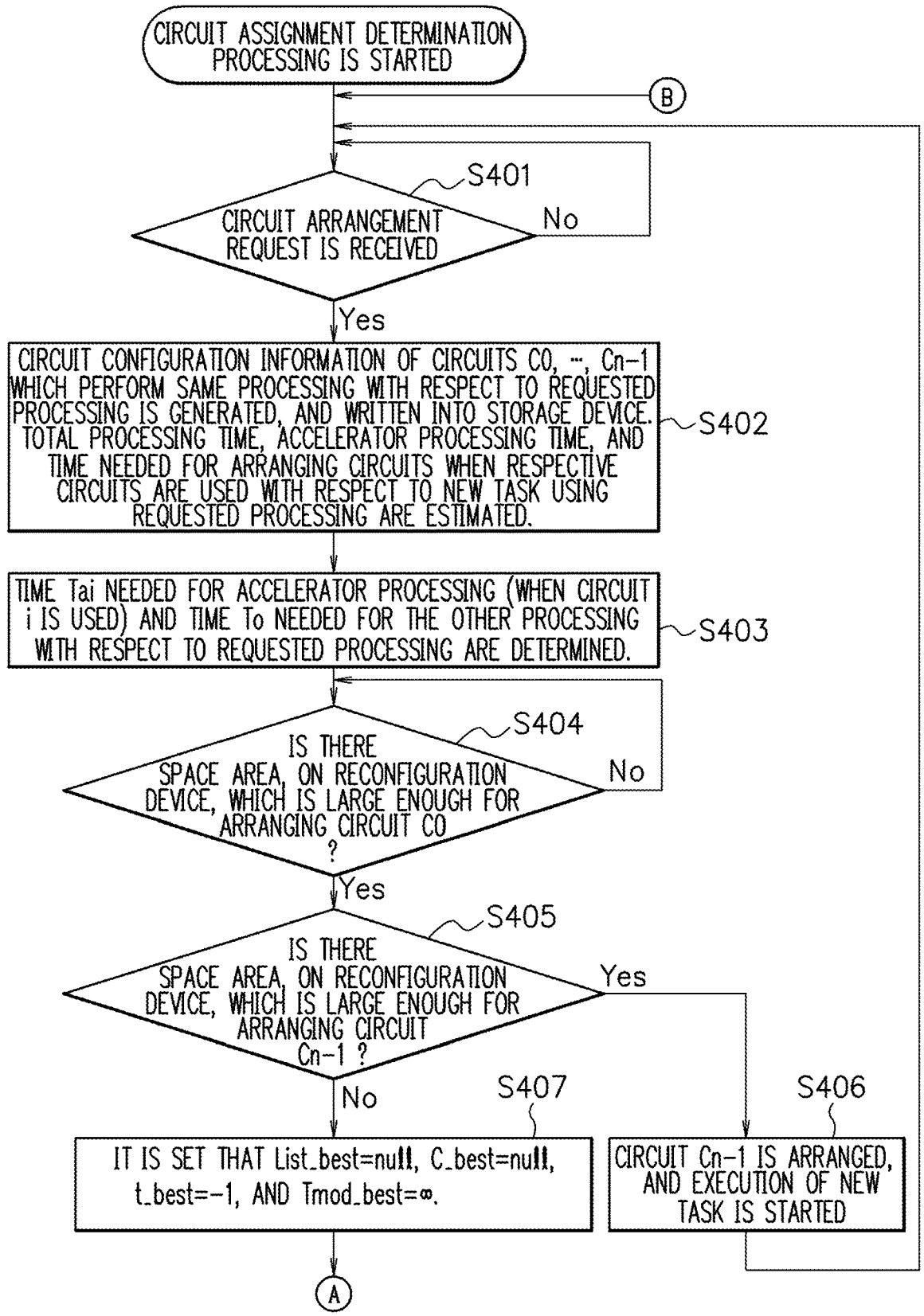
FIG. 4 is a flow chart illustrating an example of circuit assignment determination processing in the present embodiment.

Hereinafter, embodiments will be described based on the drawings.

FIG. 1 is a diagram illustrating a configuration example of an information processing apparatus in an embodiment. The information processing apparatus in the present embodiment includes a central processing unit (CPU) 110, a reconfiguration device 120, and a storage device 130, which are connected to be able to communicate via a bus 140. Note that FIG. 1 illustrates the CPU 110, the reconfiguration device 120, and the storage device 130, but, another functional unit may also be provided.

The CPU 110 reads a program from the storage device 130 or the like and executes the program to realize a function of a controller 111, thereby comprehensively controlling the information processing apparatus. For example, the controller 111 of the CPU 110 instructs the reconfiguration device 120 to execute processing, or controls execution of calculation processing or memory access processing with respect to the storage device 130 or the like by the CPU, in accordance with a program to be executed.

The controller 111 includes a circuit assignment determination unit 112 which performs circuit assignment determination processing, and a circuit assignment switch unit 113 which performs circuit assignment switch processing. The circuit assignment determination unit 112 and the circuit assignment switch unit 113 are realized when, for example, programs are read from the storage device 130 or the like and executed.

When, in accordance with a start of a new task, arrangement of a processing circuit related to the new task in the reconfiguration device 120 is requested, the circuit assignment determination unit 112 determines a circuit assignment. At this time, the circuit assignment determination unit 112 takes not only a space area in the reconfiguration device 120 but also an area which is being used by one or more of existing tasks into consideration, and determines a circuit assignment by which a predicted end time of processing in all of the related tasks becomes short. The circuit assignment switch unit 113 reconfigures a logic circuit of the reconfiguration device 120 based on the circuit assignment determined by the circuit assignment determination unit 112, and instructs execution of each task in the reconfigured processing circuit.

The reconfiguration device 120 is an electronic circuit which includes programmable plural area 121, and which can partially change a circuit configuration of the programmable area without stopping an operation of a logic circuit in operation. The reconfiguration device 120 is an electronic circuit capable of changing a configuration of a logic circuit through a dynamic partial reconfiguration. The reconfiguration device 120 is, for example, an FPGA supports a dynamic partial reconfiguration.

The storage device 130 stores respective pieces of information related to processing in the information processing apparatus in the present embodiment. The storage device 130 holds, for example, processing information 131, arrangement information 132, circuit configuration information 133, and a program 134. The processing information 131 includes information of a ratio of hardware processing and software processing in a task, details of processing performed in the reconfiguration device 120, and progress of a task, regarding each task of a new task to be executed and an existing task in execution. In the present embodiment, processing performed in the reconfiguration device 120 in each task is called hardware processing, and processing other than the above is called software processing.

The arrangement information 132 includes information indicating arrangement of a processing circuit for each task in the reconfiguration device 120, and a space area in the reconfiguration device 120. The circuit configuration information 133 is circuit configuration information for configuring a processing circuit for each task in the reconfiguration device 120, and holds a plurality of pieces of circuit configuration information with different circuit performances (circuit area) regarding each of tasks. The program 134 is a program executed by the CPU 110, and includes a program for executing the circuit assignment determination processing and a program for executing the circuit assignment switch processing.

The circuit assignment in the reconfiguration device in the present embodiment will be described by referring to FIG. 2A to FIG. 2C, and FIG. 3A and FIG. 3B. It is assumed that the reconfiguration device 120 is used for a task 0 and a task 1, in which a processing circuit related to the task 0 is arranged in an area 201, and a processing circuit related to the task 1 is arranged in an area 202, as illustrated in FIG. 2A. An area 203 is a space area which is not used.

When, in accordance with a start of a new task, arrangement of a processing circuit related to the new task in the reconfiguration device 120 is requested under this state, the circuit assignment determination unit 112 determines a plurality of circuit assignment candidates when processing circuits for an existing task and the new task capable of being arranged in an area as a result of combining an area used by the existing task and a space area, are respectively arranged. Further, the circuit assignment determination unit 112 selects, among the determined plurality of circuit assignment candidates, a circuit assignment by which a predicted processing time until when all of the tasks are terminated becomes the shortest. The circuit assignment switch unit 113 reconfigures the circuit configuration of the reconfiguration device 120, in accordance with the circuit assignment selected by the circuit assignment determination unit 112.

When, in accordance with a start of a new task 2, arrangement of a processing circuit related to the task 2 in the reconfiguration device 120 is requested, for example, the circuit assignment determination unit 112 determines a plurality of circuit assignment candidates when processing circuits related to the task 0 and the task 2 capable of being arranged in an area 204 as a result of combining the area 201 in which the processing circuit related to the task 0 is arranged and the space area 203, are respectively arranged. Further, for example, the circuit assignment determination unit 112 determines a plurality of circuit assignment candidates when processing circuits related to the task 1 and the task 2 capable of being arranged in an area 205 as a result of combining the area 202 in which the processing circuit related to the task 1 is arranged and the space area 203, are respectively arranged. Further, for example, the circuit assignment determination unit 112 determines a plurality of circuit assignment candidates when processing circuits related to the tasks 0 to 2 capable of being arranged in an area 206 as a result of combining the areas 201 and 202 in which the processing circuits related to the tasks 0 and 1 are respectively arranged and the space area 203, are respectively arranged.

Here, it is assumed that in the processing circuits related to the tasks 0 to 2, a throughput of each of the processing circuits and a processing time is a relation as illustrated in FIG. 3A. In FIG. 3A, 301 indicates a relation between a throughput of the processing circuit related to the task 0 and a processing time, 302 indicates a relation between a throughput of the processing circuit related to the task 1 and a processing time, and 303 indicates a relation between a throughput of the processing circuit related to the task 2 and a processing time. Further, 304 corresponds to the currently-mounted processing circuit related to the task 0, and 305 corresponds to the currently-mounted processing circuit related to the task 1.

In the example illustrated in FIG. 3A, even the currently-mounted processing circuit related to the task 1 enables sufficient speed-up, and further, in the processing circuit related to the task 0, even if the throughput of the processing circuit is lowered, an influence with respect to the processing time is small. Accordingly, in the present example, the circuit assignment determination unit 112 judges that the influence with respect to the processing time is small when the area 201 in which the processing circuit related to the task 0 is arranged is used, and determines circuit assignment candidates when the processing circuits related to the task 0 and the task 2 capable of being arranged in the area 204 as a result of combining the area 201 and the space area 203, are respectively arranged.

The above is illustrated in FIG. 3B. FIG. 3B illustrates a processing time of each of the task 0 and the task 2 when the performance of the processing circuit related to the task 2 is changed. In FIG. 3B, 306 indicates a remaining processing time of the task 0, and 307 indicates a processing time of the task 2. In this case, when the processing circuits related to the task 0 and the task 2 are respectively arranged so as to correspond to 308, the processing time until when all of the tasks are terminated becomes the shortest.

Therefore, the circuit assignment determination unit 112 determines a circuit assignment in which, in the area 204 formed of eight unit areas, the processing circuit related to the task 0 is arranged in an area 207 (or 210) formed of two unit areas, and the processing circuit related to the task 2 is arranged in an area 208 (or 209) formed of six unit areas, as illustrated in FIG. 2A, for example. The circuit assignment switch unit 113 performs reconfiguration (RC) of the processing circuits related to the task 0 and the task 2 in the reconfiguration device 120, through a dynamic partial reconfiguration, during a period of time 211 to time 212, to thereby execute the task 0 and the task 2, as illustrated in FIG. 2B.

When the circuit configuration of the processing circuit related to the task 2 which is to be arranged in the area 209 and the circuit configuration of the processing circuit related to the task 0 formerly arranged in that area are the same, it is also possible to design such that the processing circuit related to the task 2 is not reconfigured, and the existing processing circuit is used. It is also possible to design such that a reconfiguration (RC) of only the processing circuit related to the task 0 is performed in the reconfiguration device 120 through a dynamic partial reconfiguration in a period of time 213 to time 214 as illustrated in FIG. 2C. When it is designed as above, it is possible to reduce a reconfiguration time regarding the processing circuit related to the task 2, and it becomes possible to execute the task 2 since the time 213.

Next, the circuit assignment determination processing in the present embodiment will be described. The circuit assignment determination processing is processing which is executed when, in accordance with a start of a new task, arrangement of a processing circuit related to the new task in the reconfiguration device 120 is requested. The circuit assignment determination processing is realized when the circuit assignment determination unit 112 of the CPU 110 reads and executes a program stored in the storage device 130 or the like.

Figure 5:
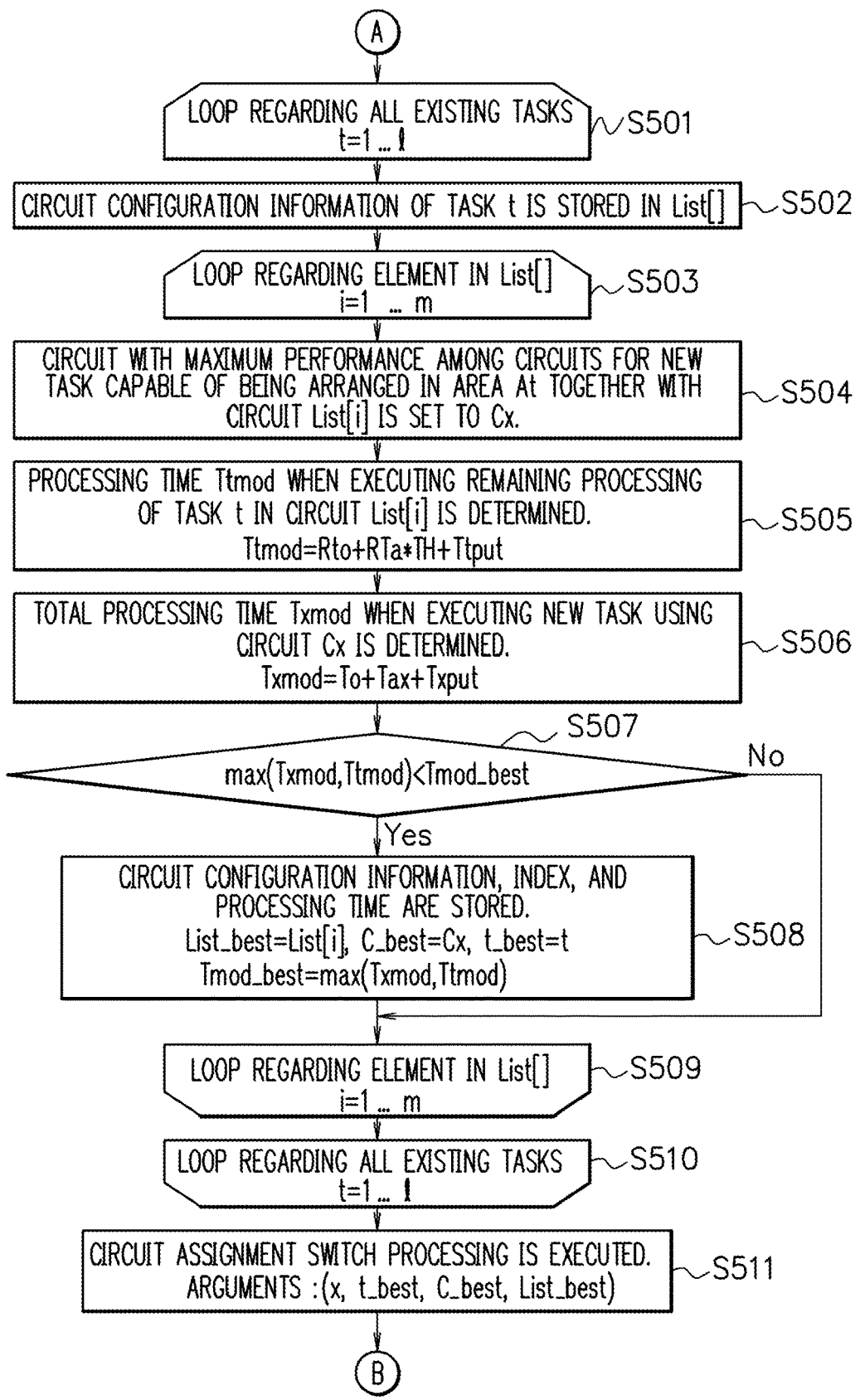
FIG. 5 is a flow chart illustrating an example of circuit assignment determination processing in the present embodiment.

Hereinafter, description will be made on a case of arranging, in an area as a result of combining a space area and an area which is being used by one existing task, processing circuits for the existing task and a new task, respectively, as an example. A time determined in the circuit assignment determination processing to be described below is a predicted time, and a processing time is a predicted end time of the processing, for example. FIG. 4 and FIG. 5 are flow charts illustrating an example of the circuit assignment determination processing in the present embodiment. As illustrated in FIG. 4, the circuit assignment determination unit 112 waits until it receives an arrangement request regarding a processing circuit related to a new task in the reconfiguration device 120 (No in S401). When the circuit assignment determination unit 112 receives the arrangement request regarding the processing circuit related to the new task in the reconfiguration device 120 (Yes in S401), it advances the processing to step S402.

In step S402, the circuit assignment determination unit 112 generates circuit configuration information of circuits C0, . . . , Cn-1 which perform the same processing with respect to processing requested by the new task, and writes the information into the storage device 130. The circuits C0, . . . , Cn-1 are circuits with different circuit performances (circuit areas), and in this case, it is set that the circuit C0 is the smallest circuit area and has a low circuit performance, and the circuit area becomes larger (the circuit performance becomes higher) as the subscript increases, namely, the circuit Cn-1 is the largest circuit area and has the highest circuit performance. Note that regarding the circuit configuration information of the circuits C0, . . . , Cn-1, it is set that the circuit assignment determination unit 112 (CPU 110) has a logic synthesis function, and when a source program designating a range in which accelerator processes is input into the circuit assignment determination unit 112, the circuit assignment determination unit 112 generates circuits which process the designated range, through logic synthesis, but, it is also possible to previously prepare the circuit configuration information as a library. Further, in step S402, the circuit assignment determination unit 112 estimates a total processing time when using respective circuits, an accelerator (hardware) processing time, and a time needed for arranging the circuits (a reconfiguration time, an arrangement time) with respect to the new task using the requested processing, and writes these into the storage device 130.

Next, in step S403, the circuit assignment determination unit 112 determines a time Tai needed for accelerator processing when a circuit C1 is used and a time To needed for the other processing with respect to the processing requested by the new task. The time Tai is determined from a logic synthesis result of the circuit C1 and an RTL simulation result. The time Tai is predicted in a manner that, for example, a table which inputs therein a parameter of an operating frequency or the like and outputs a throughput is generated, and a value obtained by referring to the table and a total processing data amount are multiplied. The time To is determined from an input source code. The time To is predicted in a manner that, for example, a processing time per one time of memory access, calculation processing such as addition, subtraction, multiplication and division, or the like, is previously stored in a table, the number of times of each processing is determined from the source code, and a coefficient obtained by referring to the table is multiplied by the number of times.

Subsequently, in step S404, the circuit assignment determination unit 112 determines whether or not there is a space area, in the reconfiguration device 120, which is large enough for arranging the circuit C0 with the smallest circuit area, and it waits until there is generated a space area which is large enough for arranging the circuit CO. When, in step S404, the circuit assignment determination unit 112 determines that there is a space area, in the reconfiguration device 120, which is large enough for arranging the circuit C0, the circuit assignment determination unit 112 determines, in step S405, whether or not there is a space area, in the reconfiguration device 120, which is large enough for arranging the circuit Cn-1 with the largest circuit area.

When, in step S405, the circuit assignment determination unit 112 determines that there is a space area, in the reconfiguration device 120, which is large enough for arranging the circuit Cn-1, the circuit assignment switch unit 113 arranges the circuit Cn-1 in the reconfiguration device 120 and the information processing apparatus starts execution of the new task in step S406. Subsequently, the processing returns to step S401, in which reception of an arrangement request regarding a processing circuit related to a new task is waited.

On the other hand, when, in step S405, the circuit assignment determination unit 112 determines that there is no space area, in the reconfiguration device 120, which is large enough for arranging the circuit Cn-1, it advances the processing to step S407. In step S407, the circuit assignment determination unit 112 sets parameters List_best, C_best, t_best, and Tmod_best to null, null, −1, and ∞ (infinite), respectively, and it advances the processing to loop processing regarding all existing tasks in steps S501 to S510 illustrated in FIG. 5. A loop variable related to the loop processing regarding all existing tasks in steps S501 to S510 is set to t (=1, 2, . . . , 1).

In the loop processing regarding all existing tasks from step S501, the circuit assignment determination unit 112 stores circuit configuration information of the existing task t in List [ ] in step S502, and it advances the processing to loop processing regarding an element in the List [ ] in steps S503 to S509. Here, regarding the List [ ], it is assumed that the smaller an index value in brackets, the smaller the circuit area. A loop variable related to the loop processing regarding the element in the List [ ] in steps S503 to S509 is set to i (=1, 2, . . . , m).

In the loop processing regarding the element in the List [ ] from step S503, the circuit assignment determination unit 112 selects a circuit with highest performance, among circuits for new task capable of being arranged in an area At together with a circuit List [i], and sets the circuit to a circuit Cx, in step S504. Note that the area At is an area as a result of combining an area used by the existing task t and a space area in the reconfiguration device 120.

Next, in step S505, the circuit assignment determination unit 112 determines a processing time Ttmod when the remaining processing of the existing task t is executed by the circuit List [i]. Regarding the processing time of the existing task t, when it is set that a remaining time of accelerator processing is Rta, a remaining time of the other processing is Rto, TH=Tai/Tak (Tak is a time needed for accelerator processing when a currently-arranged circuit Ck for existing task t is used), and an arrangement time of the circuit List [i] is Ttput, the processing time Ttmod is expressed by Ttmod=Rto+Rta×TH+Ttput. Note that when the circuit List [i] is the same as the currently-arranged circuit for existing task t, the arrangement time Ttput is set to 0.

Next, in step S506, the circuit assignment determination unit 112 determines a total processing time Txmod when a new task is executed by using the circuit Cx selected in step S503. When the arrangement time of the circuit Cx determined in step S402 is set to Txput, the total processing time Txmod is expressed by Txmod=To+Tax+Txput. When the circuit List [i] is not the same as the currently-arranged circuit for existing task t, and the circuit Cx is the same as the currently-arranged circuit for existing task t, the arrangement time Txput is set to 0.

Subsequently, in step S507, the circuit assignment determination unit 112 determines whether or not the maximum time in the processing time Ttmod determined in step S505 and the total processing time Txmod determined in step S506 is shorter than the time indicated by the parameter Tmod_best. When the circuit assignment determination unit 112 determines that the maximum time in the processing time Ttmod and the total processing time Txmod is shorter than the time indicated by the parameter Tmod_best (Yes in S507), it advances the processing to step S508, and when the circuit assignment determination unit 112 determines otherwise, it skips step S508 and advances the processing to step S509.

In step S508, the circuit assignment determination unit 112 stores the circuit configuration information, the index value, and the processing time. Concretely, the circuit assignment determination unit 112 sets the parameters List_best, C_best, t_best, and Tmod_best to the circuit List [i], the circuit Cx, the existing task t, and the maximum value in the processing time Ttmod and the total processing time Txmod, respectively, and it advances the processing to step S509.

When the loop processing regarding the element in the List [ ] regarding the loop variable i=1, 2, . . . , m is terminated in step S509, the circuit assignment determination unit 112 advances the processing to step S510. When the loop processing related to all existing tasks regarding the loop variable t=1, 2, . . . , l is terminated in step S510, the circuit assignment determination unit 112 advances the processing to step S511.

Figure 6:
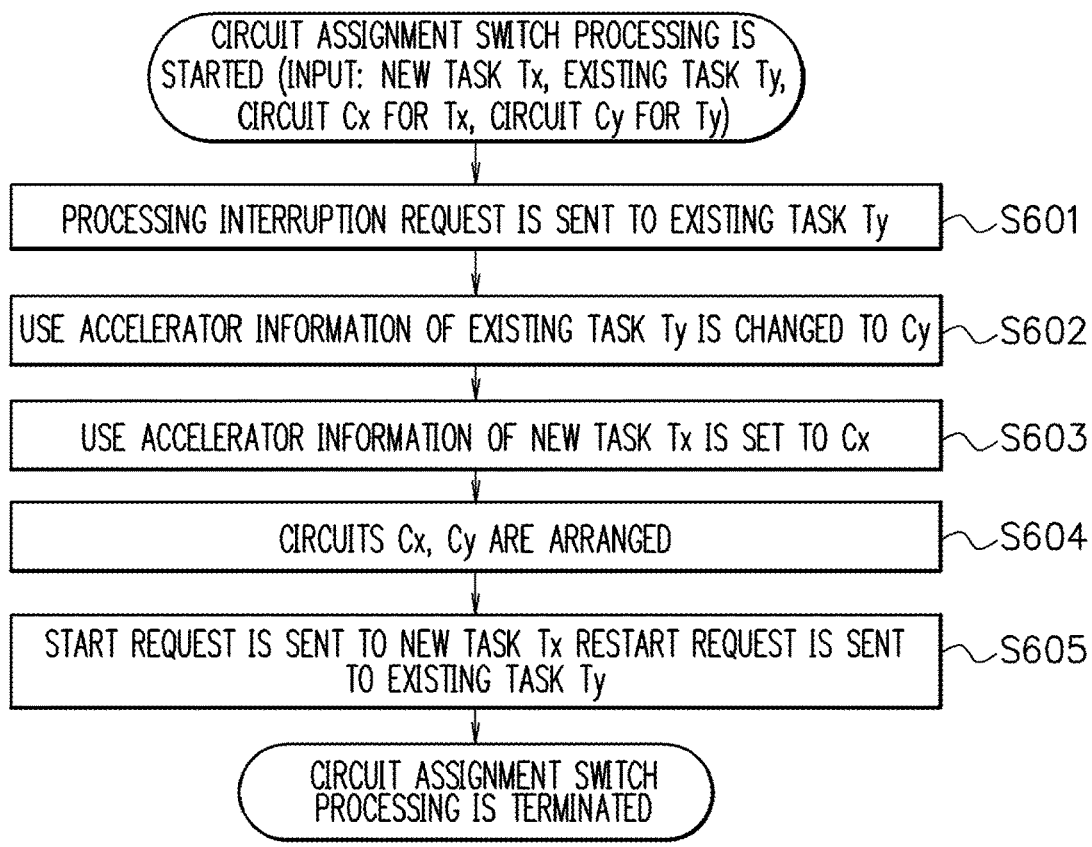
FIG. 6 is a flow chart illustrating an example of circuit assignment switch processing in the present embodiment.

In step S511, the circuit assignment switch unit 113 executes circuit assignment switch processing illustrated in FIG. 6, in accordance with the circuit assignment determined as described above. At this time, the circuit assignment switch unit 113 executes the circuit assignment switch processing by using information regarding the new task (x), the existing task in which the circuit assignment is to be changed (t_best), the circuit for new task (C_best), and the circuit for existing task after the circuit assignment is changed (List_best) determined as described above, as arguments. When the circuit assignment switch processing is terminated, the processing returns to step S401, in which reception of an arrangement request regarding a processing circuit related to a new task is waited.

FIG. 6 is a flow chart illustrating an example of the circuit assignment switch processing in the present embodiment. The circuit assignment switch processing illustrated in FIG. 6 is realized when the circuit assignment switch unit 113 of the CPU 110 reads and executes a program stored in the storage device 130 or the like. A new task Tx, an existing task Ty, a circuit Cx for new task Tx, and a circuit Cy for existing task Ty to be input, correspond to the new task (x), the existing task in which the circuit assignment is to be changed (t_best), the circuit for new task (C_best), and the circuit for existing task after the circuit assignment is changed (List_best), respectively, illustrated in step S511 in FIG. 5.

When the circuit assignment switch processing is started, the circuit assignment switch unit 113 sends, in step S601, a processing interruption request with respect to the existing task Ty in execution in which the circuit assignment is to be changed. Next, when the processing with respect to the existing task Ty is interrupted in response to the request, the circuit assignment switch unit 113 changes use accelerator information (circuit configuration information) of the existing task Ty to circuit configuration information of the circuit Cy in step S602, and sets use accelerator information (circuit configuration information) of the new task Tx to circuit configuration information of the circuit Cx in step S603. Note that regarding step S602 and step S603, it is also possible to design such that the processing of step S603 is performed and then the processing of step S602 is performed.

Next, in step S604, the circuit assignment switch unit 113 arranges, in an area as a result of combining an area used by the existing task Ty and a space area in the reconfiguration device 120, the circuit Cx for new task Tx and the circuit Cy for existing task Ty based on the respective pieces of circuit configuration information. In step S605, the circuit assignment switch unit 113 sends a processing start request with respect to the new task Tx and sends a processing restart request with respect to the interrupted existing task Ty, to thereby start the execution of the new task Tx and the existing task Ty, and it terminates the circuit assignment switch processing.

According to the present embodiment, when a processing circuit related to a new task is arranged in the reconfiguration device 120, a combination of processing circuits, among processing circuits for each of the new task and an existing task capable of being arranged in an area as a result of combining an area used by the existing task in execution and a space area in the reconfiguration device 120, by which it takes the shortest time for completing the processing of those tasks, is selected and arranged in the reconfiguration device 120. Consequently, it is possible to properly conduct the circuit assignment with respect to each task by taking the influence exerted on the task by the circuit performance into consideration, and thus the processing performance of the information processing apparatus can be improved.

Figure 7A:
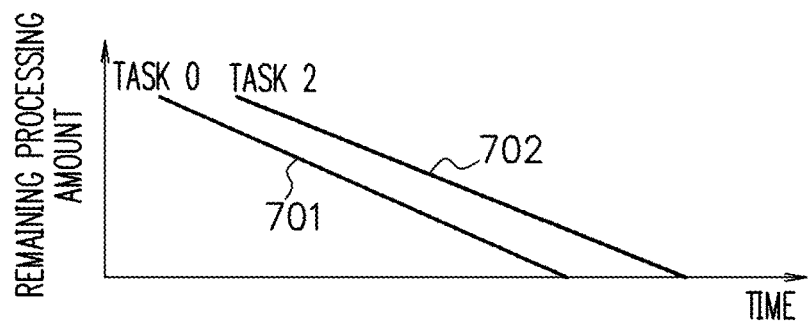
FIG. 7A and FIG. 7B are diagrams explaining a change of processing time when the present embodiment is applied.

For example, if an arrangement request of a processing circuit related to a new task 2 is issued during when a processing circuit related to a task 0 is arranged in the reconfiguration device 120 to execute the task 0, and the processing circuit related to the new task 2 is arranged in a space area in the reconfiguration device 120, a time taken for completing the processing of the task 0 and the task is as exemplified in FIG. 7A. Note that in FIG. 7A, 701 indicates a remaining processing amount and a processing time related to the existing task 0, and 702 indicates a remaining processing amount and a processing time related to the new task 2 (the same applies to FIG. 7B).

Figure 7B:
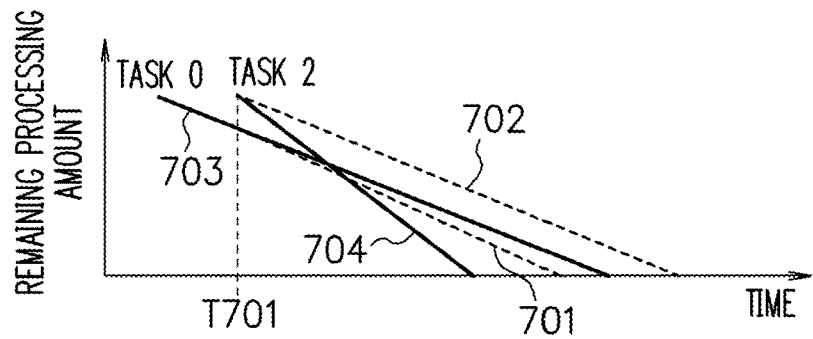

On the contrary, by applying the present embodiment in which the circuit assignment is changed at a time T701, and circuits being a combination of processing circuits by which it takes the shortest time for completing the processing of the task 0 and the task 2 are arranged, through a dynamic reconfiguration, in the area as a result of combining the area in which the processing circuit related to the task 0 is arranged and the space area in the reconfiguration device 120, a period of time for completing the processing of the task 0 and the task 2 is reduced as illustrated in FIG. 7B, resulting in that the processing performance of the information processing apparatus is improved. In FIG. 7B, 703 indicates a remaining processing amount and a processing time related to the existing task 0 after changing the circuit assignment, and 704 indicates a remaining processing amount and a processing time when the circuit assignment of the existing task 0 is changed and then the processing circuit related to the new task 2 is arranged.

Figure 8:
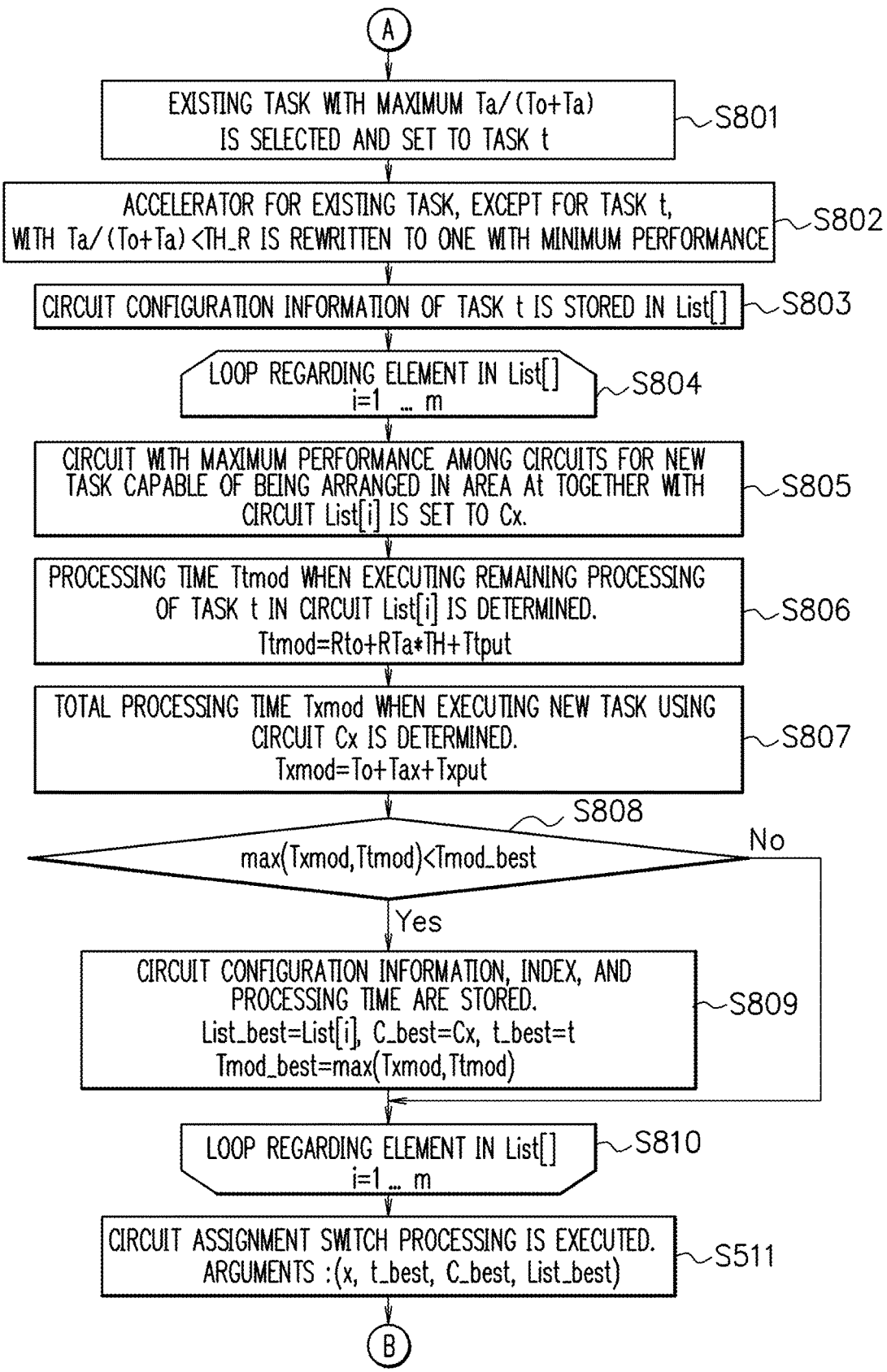
FIG. 8 is a flow chart illustrating another example of the circuit assignment determination processing in the present embodiment.

Note that the present embodiment is not limited to the above-described example, and it is also possible to design such that, regarding a plurality of tasks in which it is judged that a change of the circuit performance exerts small influence on processing of the task, those processing circuits are changed to circuits with low performance, and then a circuit assignment which enables reduction in processing time is determined, as illustrated in FIG. 8, for example. FIG. 8 is a flow chart illustrating another example of the circuit assignment determination processing in the present embodiment.

In the circuit assignment determination processing illustrated in FIG. 8, processing up to step S801 is similar to the processing in the flow chart illustrated in FIG. 4. In step S801, the circuit assignment determination unit 112 selects an existing task in which a ratio $Ta/(To+Ta)$ of a time Ta needed for accelerator processing when using a circuit which is currently arranged in the reconfiguration device 120 to a time (To+Ta) as a result of combining the time Ta and a time To needed for the other processing becomes the maximum, and sets the existing task to an existing task t.

Next, in step S802, regarding a task, among existing tasks except for the existing task t selected in step S801, having the ratio Ta/(To+Ta) of smaller than a certain value TH_R, in other words, having a small ratio of the processing time of the accelerator processing to the entire processing time, the circuit assignment determination unit 112 replaces a processing circuit for the task with a circuit with minimum performance. Subsequently, in step S803, the circuit assignment determination unit 112 stores circuit configuration information of the existing task t in the List [ ], and it advances the processing to loop processing regarding the element in the List [ ] in steps S804 to S810. The pieces of processing in steps S804 to S810 correspond to the pieces of processing in steps S503 to S509 illustrated in FIG. 5, respectively, and the loop processing regarding the element in the List [ ] in steps S804 to S810 is similar to the loop processing regarding the element in the List [ ] in steps S503 to S509 illustrated in FIG. 5, so that explanation will be omitted.

When the loop processing regarding the element in the List [ ] in steps S804 to S810 is terminated, the circuit assignment switch unit 113 executes, in step S811, circuit assignment switch processing, in a similar manner to step S511 illustrated in FIG. 5. When the circuit assignment switch processing is terminated, reception of an arrangement request regarding a processing circuit related to a new task is waited.

Although description is made on a case where, in an area as a result of combining a space area and an area which is being used by one existing task, processing circuits for the existing task and the new task are arranged, respectively, namely, a case where a circuit assignment of the reconfiguration device regarding one existing task is changed, the present embodiment is not limited to this. It is also possible to employ a case where, in an area as a result of combining a space area and an area which is being used by one or more of existing tasks whose number is arbitrary, respective processing circuits for the existing task(s) and the new task are arranged, respectively, namely, it is also possible to change a circuit assignment of the reconfiguration device regarding one or more of existing tasks whose number is arbitrary.

Figure 9:
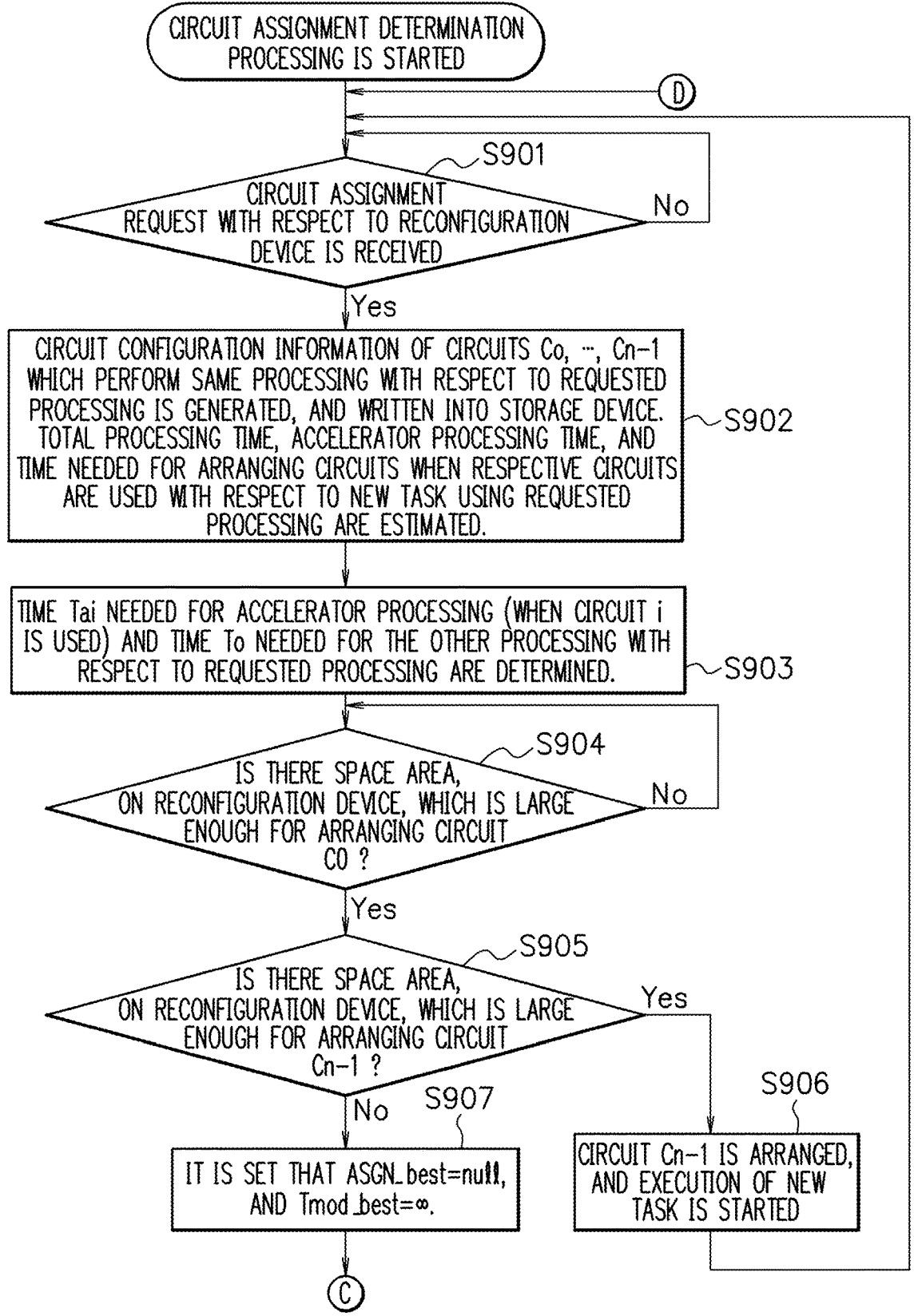
FIG. 9 is a flow chart illustrating an example of circuit assignment determination processing in the present embodiment.
Figure 10:
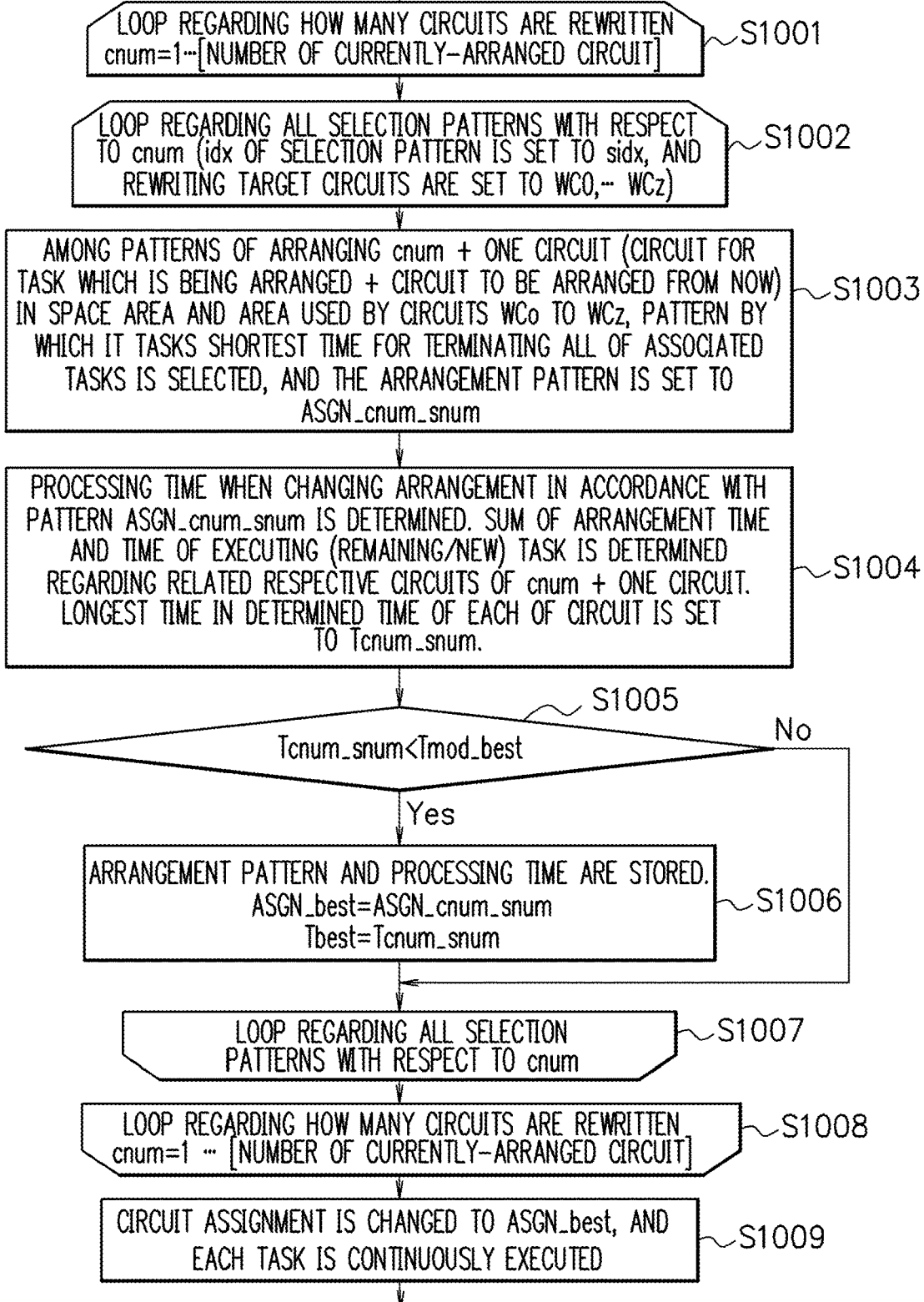
FIG. 10 is a flow chart illustrating an example of circuit assignment determination processing in the present embodiment.
Figure 11A:
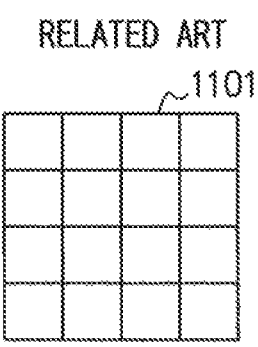
FIG. 11A to FIG. 11F are diagrams illustrating an example of circuit arrangement in an FPGA enabling a dynamic partial reconfiguration.
Figure 11B:
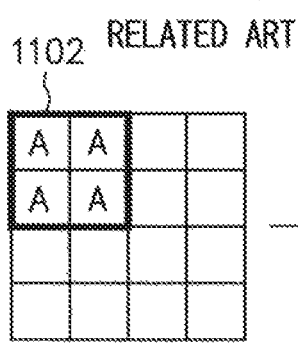
Figure 11C:
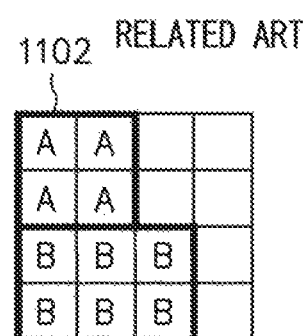
Figure 11D:
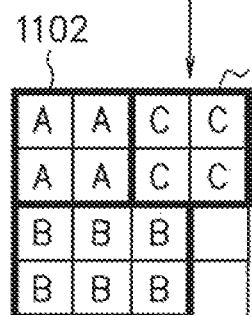
Figure 11E:
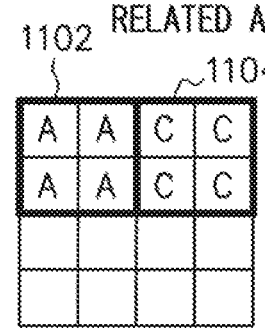
Figure 11F:
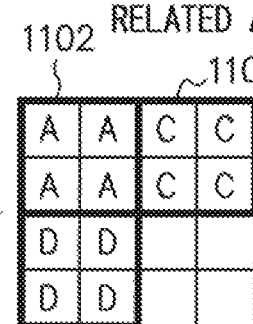

FIG. 9 and FIG. 10 are flow charts illustrating an example of circuit assignment determination processing when a circuit assignment regarding one or more of existing tasks is changed to arrange a processing circuit related to a new task in the reconfiguration device. In FIG. 9, the circuit assignment determination unit 112 waits until it receives an arrangement request regarding a processing circuit related to a new task in the reconfiguration device 120 (No in S901), and when the circuit assignment determination unit 112 receives the arrangement request regarding the processing circuit related to the new task in the reconfiguration device 120 (Yes in S901), it advances the processing to step S902.

In step S902, the circuit assignment determination unit 112 generates circuit configuration information of circuits C0, . . . , Cn-1 which perform the same processing with respect to processing requested by the new task, and writes the information into the storage device 130, in a similar manner to step S402 illustrated in FIG. 4. Further, the circuit assignment determination unit 112 estimates a total processing time when using respective circuits, an accelerator (hardware) processing time, and a time needed for arranging the circuits (a reconfiguration time, an arrangement time) with respect to the new task using the requested processing, and writes these into the storage device 130, in a similar manner to step S402 illustrated in FIG. 4.

Next, in step S903, the circuit assignment determination unit 112 determines a time Tai needed for accelerator processing when a circuit C1 is used and a time To needed for the other processing with respect to the processing requested by the new task, in a similar manner to step S403 illustrated in FIG. 4. Subsequently, in step S904, the circuit assignment determination unit 112 waits until there is generated a space area, in the reconfiguration device 120, which is large enough for arranging a circuit C0 with the smallest circuit area, and when there is a space area in which the circuit C0 can be arranged, the processing proceeds to step S905. In step S905, the circuit assignment determination unit 112 determines whether or not there is a space area, in the reconfiguration device 120, which is large enough for arranging the circuit Cn-1 with the largest circuit area.

When, in step S905, the circuit assignment determination unit 112 determines that there is a space area, in the reconfiguration device 120, which is large enough for arranging the circuit Cn-1, the circuit assignment switch unit 113 arranges the circuit Cn-1 in the reconfiguration device 120 and the information processing apparatus starts execution of the new task in step S906. Subsequently, the processing returns to step S901, in which reception of an arrangement request regarding a processing circuit related to a new task is waited.

On the other hand, when, in step S905, the circuit assignment determination unit 112 determines that there is no space area, in the reconfiguration device 120, which is large enough for arranging the circuit Cn-1, it advances the processing to step S907. In step S907, the circuit assignment determination unit 112 sets parameters ASGN_best and Tmod_best to null and ∞ (infinite), respectively, and it advances the processing to loop processing in steps S1001 to S1008 illustrated in FIG. 10 regarding how many circuits are rewritten. A loop variable related to the loop processing in steps 51001 to 51008 regarding how many circuits are rewritten is set to cnum (=1, 2, . . . , number of circuit currently arranged in the reconfiguration device).

In the loop processing from step S1001 regarding how many circuits are rewritten, the circuit assignment determination unit 112 advances, in step S1002, the processing to loop processing of all selection patterns with respect to the variable cnum in steps S1002 to S1007. In the loop processing of all selection patterns with respect to the variable cnum in steps S1002 to S1007, an index value idx of the selection pattern is set to sidx, and rewriting target circuits whose circuit assignment is to be changed are set to WC0, . . . , WCz.

In the loop processing of all selection patterns with respect to the variable cnum from step S1002, the circuit assignment determination unit 112 selects, in step S1003, a pattern by which it takes the shortest time for terminating all of associated tasks, among patterns of arranging (cnum+1) circuit (a circuit for task which is being arranged+a circuit for new task) in a space area and an area used by the circuits WC0 to WCz in the reconfiguration device 120, and sets the arrangement pattern to ASGN_cnum_snum.

Next, in step S1004, the circuit assignment determination unit 112 determines a processing time when changing the arrangement of circuits related to respective tasks in accordance with the arrangement pattern ASGN_cnum_snum. The circuit assignment determination unit 112 determines, regarding the associated respective circuits of (cnum+1) circuit for tasks, a sum of an arrangement time for arranging the circuits in the reconfiguration device and a remaining processing time in the case the existing task, and a sum of an arrangement time for arranging the circuits in the reconfiguration device and a total processing time in the case of the new task, respectively. Further, the circuit assignment determination unit 112 sets the longest time in the sum of the arrangement time and the processing time determined for each of the circuits, to Tcnum_snum. Note that it is set that the processing time of each task is a time as a result of summing up a time needed for the accelerator processing and a time needed for the other processing. Further, regarding a circuit which does not need rewriting, an arrangement time of the circuit is set to 0.

Next, in step S1005, the circuit assignment determination unit 112 determines whether or not the processing time Tcnum_snum determined in step S1004 is shorter than the time indicated by the parameter Tmod_best. When the circuit assignment determination unit 112 determines that the processing time Tcnum_snum is shorter than the time indicated by the parameter Tmod_best (Yes in S1005), it advances the processing to step S1006, and when the circuit assignment determination unit 112 determines otherwise, it skips step S1006 and advances the processing to step S1007.

In step S1006, the circuit assignment determination unit 112 stores the arrangement pattern of the circuit and the processing time. Concretely, the circuit assignment determination unit 112 sets the parameters ASGN_best and Tmod_best to the arrangement pattern ASGN_cnum_snum and the processing time Tcnum_snum, respectively, and it advances the processing to step S1007. When the loop processing of all selection patterns with respect to cnum is terminated in step S1007, the circuit assignment determination unit 112 advances the processing to step S1008. When the loop processing regarding how many circuits are rewritten is terminated in step S1008, it advances the processing to step S1009.

In step S1009, the circuit assignment switch unit 113 executes circuit assignment switch processing of circuit assignment in accordance with the parameter ASGN_best, and executes processing of respective tasks using the changed circuits. When the circuit assignment switch processing is terminated, the processing returns to step S901, in which reception of an arrangement request regarding a processing circuit related to a new task is waited.

Note that a program which realizes execution of the processing in the above-described embodiments and which is stored in a storage device so that it can be realized by being read by the CPU, for example, is embraced in the embodiments. Further, a program product realizing the functions in the above-described embodiments by the CPU's execution and processing of the program, for example, is embraced in the embodiments. The aforementioned program product includes the program itself realizing the functions of the above-described embodiments, and an information processing apparatus into which the aforementioned program is read. Further, as the program product, there are a transmitting device which can provide the aforementioned program to an information processing apparatus communicatably connected thereto via a network, a network system provided with this transmitting device, and the like.

It should be noted that all of the above-described embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

In one aspect of an embodiment, it is possible to improve a throughput of the entire information processing apparatus to improve a processing performance by properly performing a circuit assignment of a reconfiguration device with respect to a task to be executed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus, comprising:
a reconfiguration device which includes a plurality of areas in which a logic can be programmed, and which can change a circuit configuration by performing a dynamic partial reconfiguration on the areas; and
a controller which determines, when arranging, in the reconfiguration device in which a first processing circuit for executing a first task in execution is arranged, a second processing circuit for executing a second task different from the first task, a circuit assignment of the first processing circuit and the second processing circuit with respect to an arrangeable area as a result of combining an using area for the first processing circuit and a space area in the plurality of areas of the reconfiguration device, based on a predicted end time until completion of the processing remaining for both the first task and the second task in a case of the first task and the second task being executed together, and arranges the first processing circuit and the second processing circuit in the reconfiguration device in accordance with the determined circuit assignment,
the controller determines the circuit assignment of the first processing circuit and the second processing circuit based on a combination for which the predicted end time becomes the shortest among combinations of the first processing circuit and the second processing circuit capable of being arranged in the arrangeable area.

2. The information processing apparatus according to claim 1, wherein when there are a plurality of the first tasks in execution, the controller changes the first processing circuit for executing the first task which does not exert an influence with respect to a processing time of the first task in execution even if the first processing circuit is changed to the first processing circuit with low performance to increase a space area in the plurality of areas of the reconfiguration device, and then determines the circuit assignment of the first processing circuit and the second processing circuit.

3. The information processing apparatus according to claim 1, wherein when there is the first task which uses a processing circuit same as a processing circuit for executing the second task, the circuit assignment of the first processing circuit and the second processing circuit is determined based on the predicted end time of the first and second task and a time taken for the circuit arrangement.

4. An information processing method of an information processing apparatus including a reconfiguration device which includes a plurality of areas in which a logic can be programmed, and which can change a circuit configuration by performing a dynamic partial reconfiguration on the areas, the information processing method comprising:
- determining, when arranging, in the reconfiguration device in which a first processing circuit for executing a first task in execution is arranged, a second processing circuit for executing a second task different from the first task, a circuit assignment of the first processing circuit and the second processing circuit with respect to an arrangeable area as a result of combining an using area for the first processing circuit and a space area in the plurality of areas of the reconfiguration device, based on a predicted end time until completion of the processing remaining for both the first task and the second task in a case of the first task and the second task executed together; and
- arranging the first processing circuit and the second processing circuit in the reconfiguration device in accordance with the determined circuit assignment,
- determines the circuit assignment of the first processing circuit and the second processing circuit based on a combination for which the predicted end time becomes the shortest among combinations of the first processing circuit and the second processing circuit capable of being arranged in the arrangeable area.

5. A non-transitory computer-readable recording medium which records a program for causing a computer of an information processing apparatus including a reconfiguration device which includes a plurality of areas in which a logic can be programmed, and which can change a circuit configuration by performing a dynamic partial reconfiguration on the areas, to execute:
- processing of determining, when arranging, in the reconfiguration device in which a first processing circuit for executing a first task in execution is arranged, a second processing circuit for executing a second task different from the first task, a circuit assignment of the first processing circuit and the second processing circuit with respect to an arrangeable area as a result of combining an using area for the first processing circuit and a space area in the plurality of areas of the reconfiguration device, based on a predicted end time until completion of the processing remaining for both the first task and the second task in a case of the first task and the second task executed together; and
- processing of arranging the first processing circuit and the second processing circuit in the reconfiguration device in accordance with the determined circuit assignment,
- the processing of determining determines the circuit assignment of the first processing circuit and the second processing circuit based on a combination for which the predicted end time becomes the shortest among combinations of the first processing circuit and the second processing circuit capable of being arranged in the arrangeable area.

* * * * *